United States Patent
Lin et al.

(10) Patent No.: US 7,755,423 B2
(45) Date of Patent: Jul. 13, 2010

(54) SIGMA DELTA CLASS D POWER AMPLIFIER AND METHOD THEREOF

(75) Inventors: Chung-Wei Lin, Pingtung County (TW); Hsin-Hong Hou, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 66 days.

(21) Appl. No.: 12/326,864

(22) Filed: Dec. 2, 2008

(65) Prior Publication Data
US 2010/0109772 A1 May 6, 2010

(30) Foreign Application Priority Data
Oct. 30, 2008 (TW) .............................. 97141850 A (51) Int. Cl.
H03F 3/38 (2006.01)
(52) U.S. Cl. ........................................ 330/10; 330/251
(58) Field of Classification Search .................. 330/10, 330/251, 207 A
See application file for complete search history.

(56) References Cited

U.S. PATENT DOCUMENTS 5,608,401 A * 3/1997 Viswanathan et al. ....... 341/144
7,330,069 B2 * 2/2008 Yamamura et al. ............ 330/10
7,548,110 B2 * 6/2009 Lin ............................... 330/10
7,612,608 B2 * 11/2009 Kozak et al. ................. 330/251

OTHER PUBLICATIONS

Article titled "A Digital Input Controller for Audio Class-D Amplifiers with 100W 0.004% THD+N and 113dB DR" authored by IDO et al., 2006 IEEE International Solid-State Circuits Conference, ISSCC 2006/ Session 19/ Analog Techniques / 19.3, pp. 348-349,658.

* cited by examiner

Primary Examiner—Henry K Choe
(74) Attorney, Agent, or Firm—Jianq Chyun IP Office (57) ABSTRACT

A sigma delta class D power amplifier includes a loop filter, a quantizer, and an output stage. The quantizer is coupled to the loop filter and quantifies an error signal according to levels of two reference signals to output a pair of mean signals, wherein different logic combinations of the mean signals belong to one of three quantum states. The output stage is coupled to the quantizer and outputs a corresponding output signal according to the different quantum states to drive a load, wherein a driving current of the output signal belongs to one of the three driving states which include at least a steady state with no current of a power amplifier.

16 Claims, 7 Drawing Sheets

SIGMA DELTA CLASS D POWER AMPLIFIER AND METHOD THEREOF

CROSS-REFERENCE TO RELATED APPLICATION

This application claims the priority benefit of Taiwan application serial no. 97141850, filed on Oct. 30, 2008. The entirety of the above-mentioned patent application is hereby incorporated by reference herein and made a part of this specification.

BACKGROUND OF THE INVENTION

1. Field of the Invention

The present invention relates to a power amplifier. More particularly, the present invention relates to a sigma delta class D power amplifier.

2. Description of Related Art

The power amplifier plays an important role in design of integrated circuits, and is widely applied to wireless communications, transmitters/receivers of television broadcasts, high-floutelity stereo equipments, microcomputers and other electronic devices. The power amplifier is used for increasing energy of a signal, so as to drive a load or a next stage circuit. Therefore, quality of the power amplifier is influenced by a power gain thereof, wherein the power gain is a ratio between an output power and an input power. Generally, the greater the power gain is, the better the amplification capability of the power amplifier is, and when an input signal is relatively small, a power gain curve of a general power amplifier may have satisfactory linearity.

According to applications of the power amplifiers, the power amplifiers are categorized into many classes mainly including class A, class B, class AB, class C and class D, etc. For example, the class D power amplifier is widely used for an audio signal processing of a handheld and mobile device since the class D power amplifier has high power conversion efficiency (greater than 90%). Moreover, some of the class D power amplifiers may have pulse width modulators to generate continuous pulses, and the pulse widths are varied according to amplitude of the audio signals, so as to control operations of switch circuits within the class D power amplifiers. However, as to a product having a relatively strict requirement for prevention of signal distortion, performance of the class D power amplifier is not as good as that of the class AB power amplifier. Therefore, a sigma-delta class D power amplifier is developed, which may have a relatively low signal distortion compared to that of the class AB power amplifier, and meanwhile the high power conversion efficiency of the class D power amplifier is still maintained, so that the sigma-delta class D power amplifier is competitive in the market.

However, since a sampling frequency of the conventional sigma-delta class D power amplifier is limited by an over sampling ratio (OSR), a frequency of the sigma-delta class D power amplifier is generally four to five times greater than that of the conventional class D power amplifier, so that a switching loss thereof is much greater than that of the conventional class D power amplifier. Thereby, in case of a relatively small power output, the power conversion efficiency of the conventional sigma-delta class D power amplifier is much less than that of the conventional class D power amplifier. Moreover, a direction of the driving current output by the conventional sigma-delta class D power amplifier only has two states of forward and backward, and a steady state of no current is not provided.

SUMMARY OF THE INVENTION

The present invention provides a sigma delta class D power amplifier including a loop filter, a quantizer, and an output stage module. The loop filter calculates a difference between an input signal and an output signal, and accumulates the difference to generate an error signal. The quantizer is coupled to the loop filter and quantifies the error signal according to levels of a first reference signal and a second reference signal, so as to output a corresponding first mean signal and a corresponding second mean signal. The output stage module is coupled to the quantizer and correspondingly generates the output signal according to the first mean signal and the second mean signal to drive a load, wherein a driving current of the output signal is at least in one of a first driving state, a second driving state and a steady state of no current.

The present invention provides a method for a sigma delta class D power amplifier, which is described as follows. First, an input signal is received, and a difference between the input signal and an output signal is calculated and accumulated to generate an error signal. Next, the error signal is quantified according to levels of a first reference signal and a second reference signal, so as to generate a corresponding first mean signal and a corresponding second mean signal. Next, a corresponding output signal is output according to the first mean signal and the second mean signal to drive a load, wherein a driving current of the output signal is at least in one of a first driving state, a second driving state and a steady state of no current.

In the the sigma delta class D power amplifier of the present invention, the quantizer is applied to quantify the error signal to generate the first mean signal and the second mean signal, wherein a different logic level combination of the first mean signal and the second mean signal corresponds to one of equivalent levels of at least three quantum states. Therefore, the output stage module generates a corresponding driving current according to the first mean signal and the second mean signal output by the quantizer, so as to drive the load. Here, the driving current has a steady state (an equivalent level state) of no current, so that power loss of the power amplifier is reduced.

In order to make the aforementioned and other features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
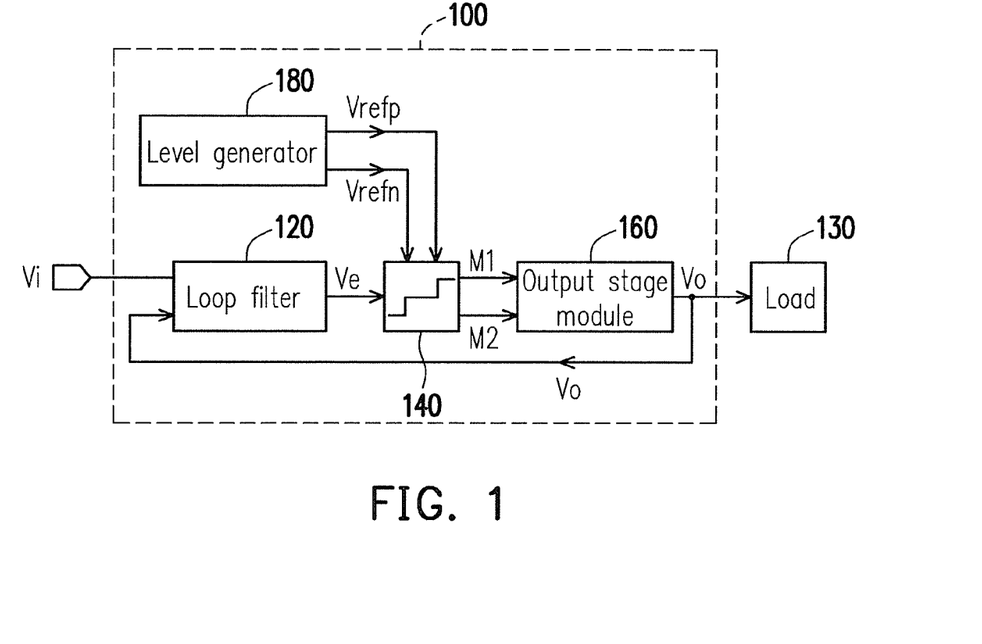
FIG. 1 is a block diagram illustrating a sigma delta class D power amplifier according to an embodiment of the present invention.

FIG. 1 is a block diagram illustrating a sigma delta class D power amplifier according to an embodiment of the present invention. Referring to FIG. 1, the sigma delta class D power amplifier 100 includes a loop filter 120, a quantizer 140, an output stage module 160 and a level generator 180.

In detail, the loop filter 120 calculates a difference between an input signal Vi and an output signal Vo, and accumulates the difference to generate an error signal Ve. The quantizer 140 is coupled to the loop filter 120 to receive the error signal Ve. The quantizer 140 quantifies the error signal Ve according to levels of a first reference signal Vrefp and a second reference signal Vrefn provided by the level generator 180, so as to output a corresponding first mean signal M1 and a corresponding second mean signal M2. Particularly, different logic level combinations of the mean signals M1 and M2 respectively correspond to one of three quantum states, wherein the three quantum states are for example, "1", "0" and "−1", as that shown in FIG. 4.

Moreover, the output stage module 160 is coupled to the quantizer 140 and receives the mean signals M1 and M2. The output stage module 160 generates the corresponding output signal Vo according to different logic level combinations of the mean signals M1 and M2 to drive a load 130. It should be noted that a driving current Io (not shown in FIG. 1) of the output signal Vo used for driving the load 130 also has different driving states corresponding to different quantum states, wherein the driving state is one of a first driving state, a second driving state and an equivalent level state.

Figure 2:
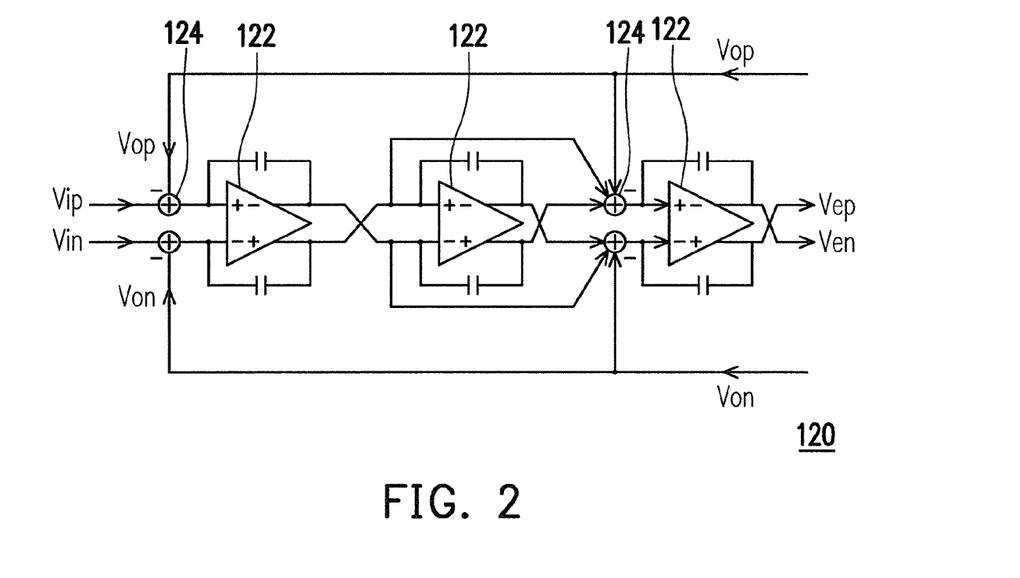
FIG. 2 is a circuit diagram illustrating a loop filter according to an embodiment of the present invention.

FIG. 2 is a circuit diagram illustrating a loop filter according to an embodiment of the present invention. In the present embodiment, the input signal Vi is, for example, differential input signals Vip and Vin, the output signal Vo is, for example, differential output signals Vop and Von, and the error signal Ve is, for example, differential error signals Vep and Ven, though the present invention is not limited thereto. Referring to FIG. 1 and FIG. 2, the loop filter 120 includes continuous-time integrators 122 and an adder 124. The loop filter 120 provides a loop response to the power amplifier 100, accumulates a difference between the input signal Vip and the output signal Vop, and accumulates a difference between the input signal Vin and the output signal Von, so as to generate the differential error signals Vep and Ven after a filtering process is performed.

Figure 3:
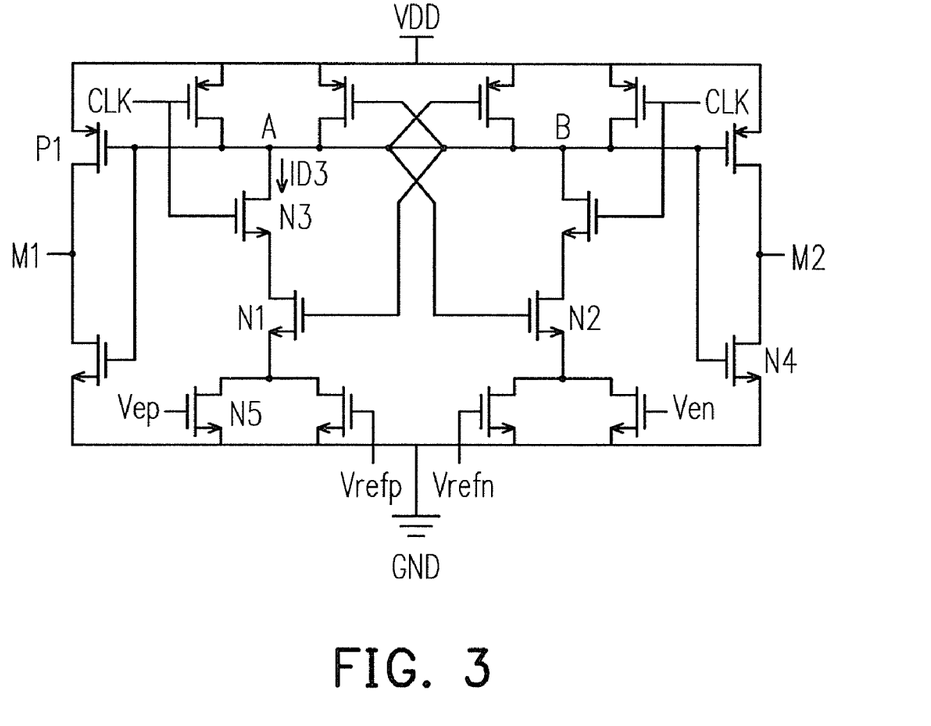
FIG. 3 is a circuit diagram illustrating a quantizer according to an embodiment of the present invention.

FIG. 3 is a circuit diagram illustrating a quantizer according to an embodiment of the present invention. Referring to FIG. 1 and FIG. 3, when a clock signal CLK is at a logic low level, the mean signals M1 and M2 are both at a logic low level "0". When the clock signal CLK is at a logic high level, and if the error signal Vep is greater than the reference signal Vrefp, transistors N1 and N3 are turned on, and a current ID3 is then transmitted to a ground terminal GND via transistors N3, N1 and N5, so that a node A has the logic low level. Therefore, the node A having the logic low level turns on a transistor P1, so that the mean signal M1 has the logic high level "1". Meanwhile, since the node A has the logic low level, a node B has the logic high level. The node B having the logic high level turns on the transistors N1 and N4, so that the mean signal M2 has the logic low level "0". Namely, when the error signal Ve input to the quantizer 140 is greater than the reference signals Vrefp and Vrefn, a logic level combination of the mean signals M1 and M2 output by the quantizer 140 is (1,0), i.e., the quantum state is "1". Similarly, when the error signal Ve input to the quantizer 140 is less than the reference signals Vrefp and Vrefn, the logic level combination of the mean signals M1 and M2 output by the quantizer 140 is (0,1), i.e., the quantum state is "−1". It should be noted that when the error signal Vep is less than the reference signal Vrefp, and the error signal Ven is greater than the reference signal Vrefn, the nodes A and B have the logic high level. Therefore, the logic level combination of the mean signals M1 and M2 output by the quantizer 140 is (0,0), i.e., the quantum state is "0".

Figure 4:
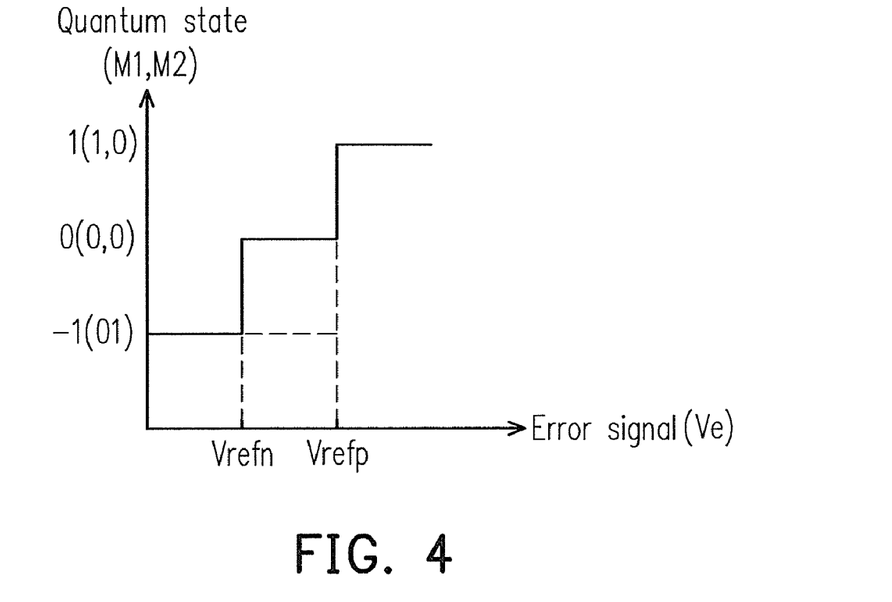
FIG. 4 is a schematic diagram illustrating different logic level combinations of mean signals M1 and M2 and levels of corresponding quantum states.

FIG. 4 is a schematic diagram illustrating different logic level combinations of the mean signals M1 and M2 and levels of the corresponding quantum states. Referring to FIG. 3 and FIG. 4, according to the aforementioned relative relation between the differential error signals Vep and Ven (i.e. the error signal Ve) and the reference signals Vrefp and Vrefn, when the differential error signals Vep and Ven (i.e. the error signal Ve) are less then the reference signals Vrefp and Vrefn, the logic level combination of the mean signals M1 and M2 output by the quantizer 140 is (0,1), wherein the quantum state corresponding to the logic level combination (0,1) of the mean signals M1 and M2 is "−1", as shown in FIG. 4.

Similarly, when the differential error signals Vep and Ven (i.e. the error signal Ve) input to the quantizer 140 are between the reference signals Vrefp and Vrefn, the logic level combination of the mean signals M1 and M2 output by the quantizer 140 is (0,0), and the corresponding quantum state is "0". Similarly, when the differential error signals Vep and Ven (i.e. the error signal Ve) input to the quantizer 140 are greater than the reference signals Vrefp and Vrefn, the logic level combination of the mean signals M1 and M2 output by the quantizer 140 is (1,0), and the quantum state corresponding to the logic level combination (1,0) of the mean signals M1 and M2 is "1".

Figure 5:
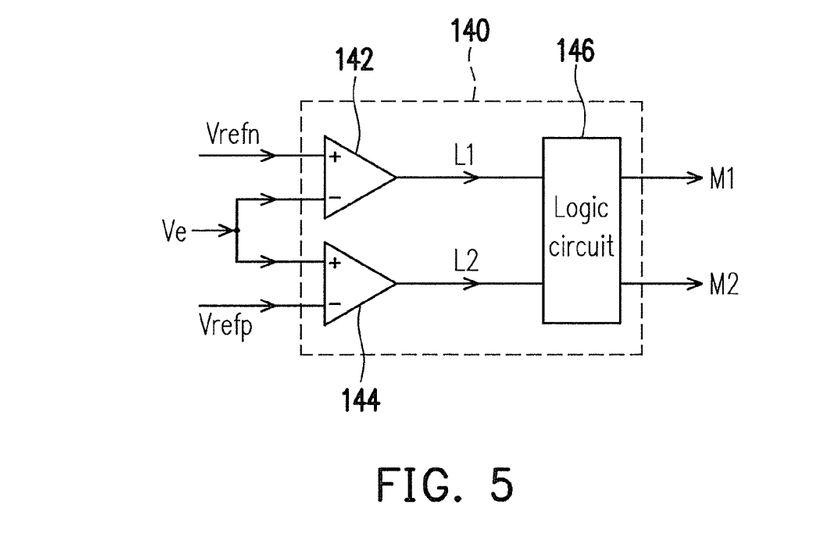
FIG. 5 is a circuit diagram illustrating a quantizer according to another embodiment of the present invention.

FIG. 5 is a circuit diagram illustrating a quantizer according to another embodiment of the present invention. Referring to FIG. 1 and FIG. 5, the error signal Ve output by the loop filter 120 is assumed to be a single-ended signal. The quantizer 140 includes comparators 142 and 144 and a logic circuit 146. The comparators 142 and 144 receive the error signal Ve from the loop filter 120 and the reference signals Vrefp and Vrefn from the level generator 180. When the error signal Ve is greater than the reference signals Vrefp and Vrefn, a logic signal L1 output by the comparator 142 has the logic low level "0", and a logic signal L2 output by the comparator 144 has the logic high level "1". Next, after the logic signals L1 and L2 are processed by the logic circuit 146, the logic circuit 146 generates the mean signals M1 and M2 with the logic level combination of (1,0).

When the error signal Ve is less than the reference signals Vrefp and Vrefn, the comparators 142 and 144 respectively output the logic signal L1 with the logic high level "1" and the logic signal L2 with the logic low level "0". The logic circuit 146 receives the logic signals L1 and L2, and generates the mean signals M1 and M2 with the logic level combination of (0,1) after logical processing.

It should be noted that when the error signal Ve is between the reference signal Vrefp and the reference signal Vrefn, the logic signals L1 and L2 output by the comparators 142 and 144 both have logic high level "1". Therefore, the logic circuit 146 outputs the mean signals M1 and M2 with the logic level combination of (0,0).

Therefore, by comparing the error signal Ve with the reference signals Vrefp and Vrefn and after processing of the logic circuit 146, the quantizer 140 outputs the mean signals M1 and M2. The logic level combinations of the mean signals M1 and M2 correspond to three different quantum states (for example, "−1", "0" and "1").

Figure 6:
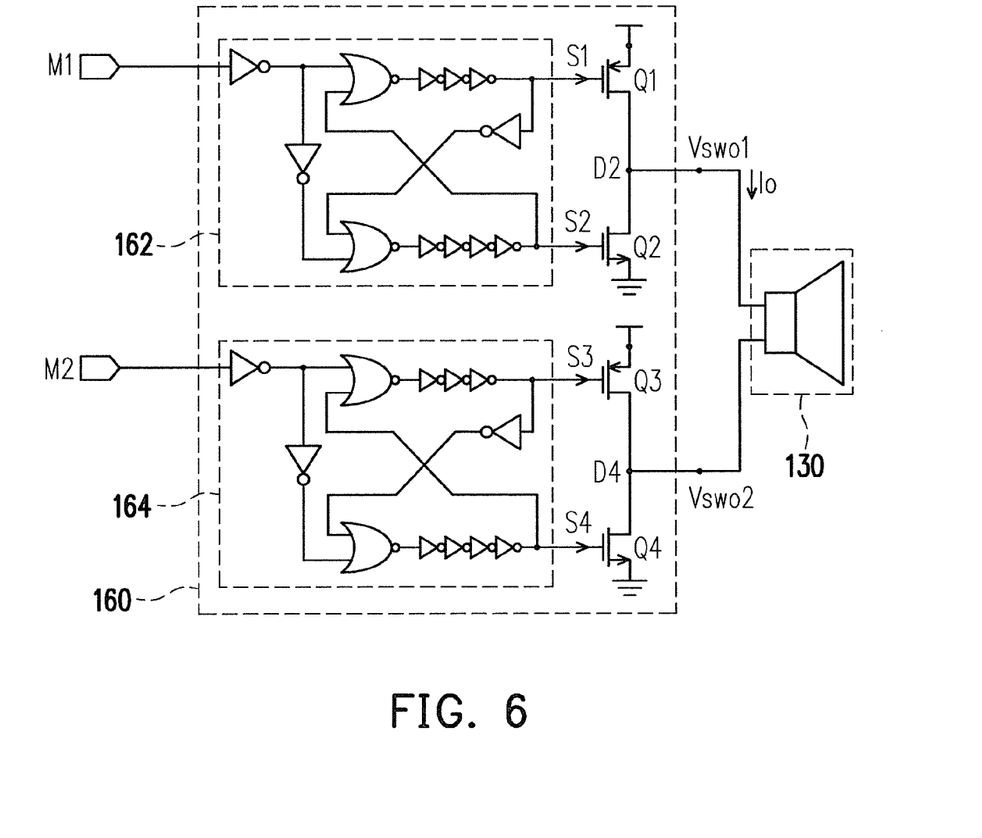
FIG. 6 is a schematic diagram illustrating an output state of a driving current and a corresponding signal level according to an embodiment of the present invention.

FIG. 6 is a schematic diagram illustrating the output stage module 160 and a driven load 130 according to an embodiment of the present invention. The output signal Vo of the output stage module 160 is represented by Vswo1 and Vswo2. Referring to FIG. 6, the output stage module 160 of the present embodiment is a full-bridge output stage module which not only includes power transistors Q1-Q4 but also includes logic units 162 and 164, and the load 130 is, for example, a speaker. The output stage module 160 is coupled to the quantizer 140, and the logic units 162 and 164 respectively receive the mean signals M1 and M2, and generate the corresponding output signal Vo (i.e. Vswo1 and Vswo2 of FIG. 6) according to the logic levels of the mean signals M1 and M2, so as to drive the load 130. Here, the driving current Io of the output signal Vo is in one of the first driving state, the second driving state and the equivalent level state.

In detail, if the logic level of the mean signal M1 received by the logic unit 162 is at the logic high level "1", the logic unit 162 correspondingly generates signals S1 and S2 of (0,0). The signals S1 and S2 with the logic low level "0" can respectively turn on the transistor Q1 and turn off the transistor Q2. Now, the output signal Vswo1 has the logic high level "1". Conversely, if the logic level of the mean signal M1 received by the logic unit 162 is at the logic low level "0", the logic unit 162 correspondingly generates the signals S1 and S2 of (1,1), so that the output signal Vswo1 has the logic low level "0".

Similarly, the logic unit 164 outputs signals S3 and S4 according to the logic level of the mean signal M2. Therefore, the logic unit 164 can turn on/off the transistors Q3 and Q4 according to the signals S3 and S4, and further determine the logic level of the output signal Vsmo2. When the mean signal M2 has the logic high level "1", the logic unit 164 correspondingly generates the signals S3 and S4 of (0,0), so that the output signal Vswo2 has the logic high level "1". When the mean signal M2 has the logic high level "0", the logic unit 164 correspondingly generates the signals S3 and S4 of (1,1), so that the output signal Vswo2 has the logic low level "0".

Figure 7:
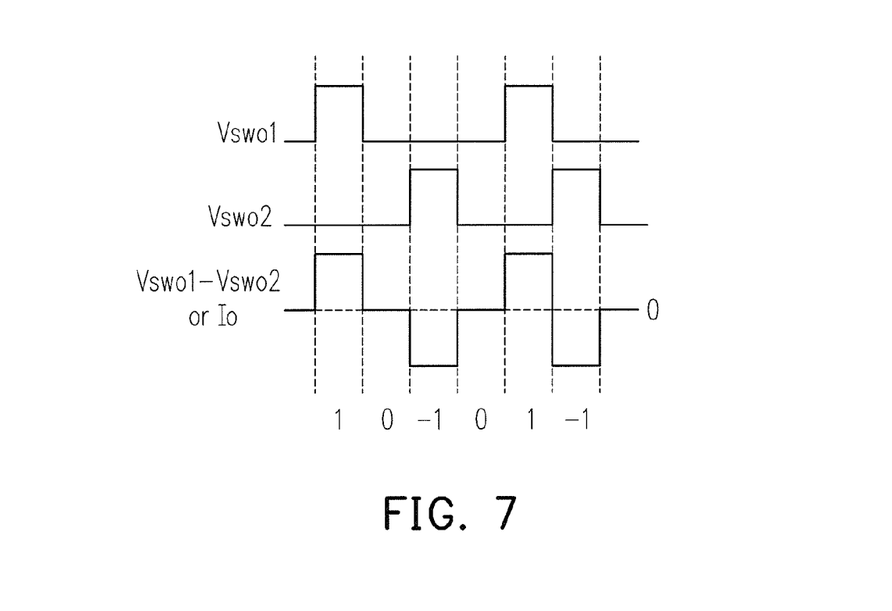
FIG. 7 is a waveform diagram illustrating output states of a driving current Io and a corresponding output signal Vo according to an embodiment of the present invention.

FIG. 7 is a waveform diagram illustrating output states of the driving current Io and the corresponding output signal Vo (i.e. Vswo1 and Vswo2) according to an embodiment of the present invention. Referring to FIG. 6 and FIG. 7, according to operational principles of the logic units 162 and 164 and the transistors Q1-Q4, when the logic level combination of the mean signals M1 and M2 received by the output stage module 160 is (1,0) (namely, the quantum state of the quantizer 140 is "1"), the logic level of the output signals Vswo1 and Vswo2 of the output stage module 160 is (1,0). Namely, the output signal Vswo1 has the high logic level and the output signal Vswo2 has the low logic level. Therefore, the driving current Io flows from the output signal Vswo1 side to the output signal Vswo2 side. In the present embodiment, as shown in FIG. 6, the driving current Io flows from a drain (i.e. a D2 point marked in FIG. 6) of the transistor Q1 to a drain (i.e. a D4 point marked in FIG. 6) of the transistor Q4, so as to drive the load 130. Now, a state of the driving current Io is defined to be the first driving state (or a forward current driving state).

Similarly, when the logic level combination of the mean signals M1 and M2 received by the output stage module 160 is (0,1) (namely, the quantum state of the quantizer 140 is "−1"), the logic level of the output signals Vswo1 and Vswo2 of the output stage module 160 is (0,1). Therefore, the driving current Io flows from a drain (i.e. a D4 point marked in FIG. 6) of the transistor Q3 to a drain (i.e. a D2 point marked in FIG. 6) of the transistor Q2, so as to drive the load 130. Now, a state of the driving current Io is defined to be the second driving state (or a backward current driving state).

It should be noted that when the logic level combination of the mean signals M1 and M2 received by the output stage module 160 is (0,0) (namely, the quantum state of the quantizer 140 is "0"), the logic level of the output signals Vswo1 and Vswo2 of the output stage module 160 is (0,0). Namely, when the level of the output signal Vswo1 is equal to the level of the output signal Vswo2 (in the present embodiment, the output signals Vswo1 and Vswo2 both have a ground level), no driving current Io flows through the load 130; namely, the state of the driving current Io is defined to be the equivalent level state (or no current driving state), and now the load 130 has no power consumption. Those of ordinary skills in the art can also implement the equivalent level state by other methods with reference to the aforementioned descriptions based on actual requirements. For example, the output signals Vswo1 and Vswo2 may simultaneously have the logic high level. In other embodiments, the transistors Q1-Q4 can be all turned off, so that the output signals Vswo1 and Vswo2 are in a floating state, so as to implement the equivalent level state.

The power amplifier 100 of the present embodiment utilizes the quantizer 140 to generate 1.5 bits mean signals M1 and M2. Here, the logic level combinations of the mean signals M1 and M2 correspond to the three different quantum states (i.e. "−1", "0" and "1"). The quantum states correspond to the driving states (i.e. the second driving state, the equivalent level state, and the first driving state) of the driving current Io output by the output stage module 160. Here, the equivalent level state represents that no driving current Io flows through the load 130. Therefore, the power amplifier 100 of the present embodiment can additionally provide a steady state of no current (the equivalent level state), so as to reduce a power loss of the power amplifier.

Figure 8:
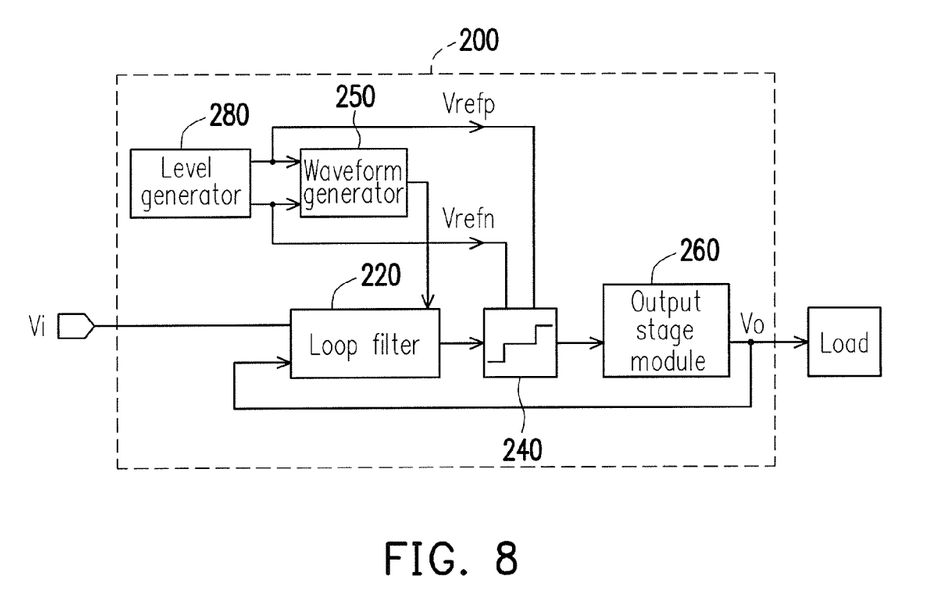
FIG. 8 is a block diagram illustrating a power amplifier according to another embodiment of the present invention.

FIG. 8 is a block diagram illustrating a power amplifier according to another embodiment of the present invention. Referring to FIG. 8, the power amplifier 200 of the present embodiment is similar to the power amplifier of the aforementioned embodiment, and a difference there between is that the power amplifier 200 further includes a waveform generator 250. The waveform generator 250 generates a triangle wave (for example, a sawtooth wave) according to the reference signals Vrefp and Vrefn of a level generator 280, so as to provide a reference frequency for a loop filter 220. It should be noted that the levels of the reference signals Vrefp and Vrefn used by a quantizer 240 of the present embodiment relate to a maximum value and a minimum value of the level of the triangle wave.

Figure 9A:
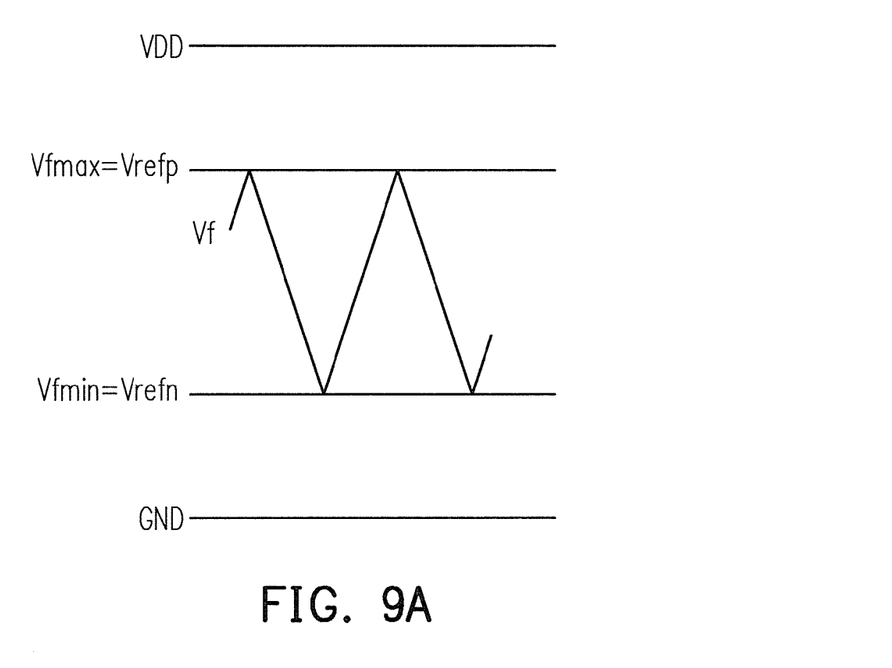
FIGS. 9A-9C are diagrams illustrating relations between a level of a triangle wave and levels of reference signals according to embodiments of the present invention.

FIG. 9A is a diagram illustrating a relation between the level of the triangle wave and the levels of the reference signals. Referring to FIG. 8 and FIG. 9A, the waveform generator 250 of the present embodiment generates a triangle wave Vf to provide the reference frequency to the loop filter 220, wherein a maximum value Vfmax of the level of the triangle wave Vf is equal to the level of the reference signal Vrefp, and a minimum value Vfmin of the level of the triangle wave Vf is equal to the level of the reference signal Vrefn, wherein the maximum value Vfmax and the minimum value Vfmin of the level of the triangle wave are between a system level VDD and the ground level GND.

According to the above design, when the input signal Vi is closed to a low level signal, the quantizer 240 does not output a pulse-width modulation (PWM) signal with a duty cycle of 50%, but outputs a PWM signal with a duty cycle of 0%. By such means, when the input signal Vi is started to be amplified, the output stage module 260 can automatically and gradually amplify the duty cycle, so as to avoid an excessive inductor current and a pop-noise phenomenon occurred when the power amplifier starts to operate. Moreover, design of an extra logic circuit is unnecessary.

Figure 9B:
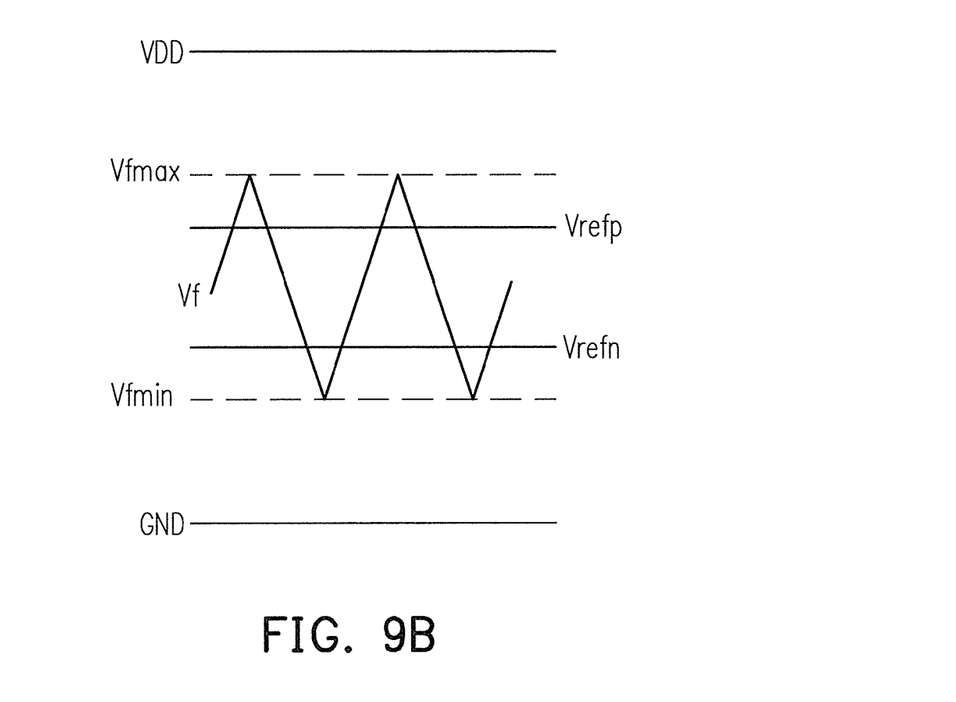
Figure 9C:
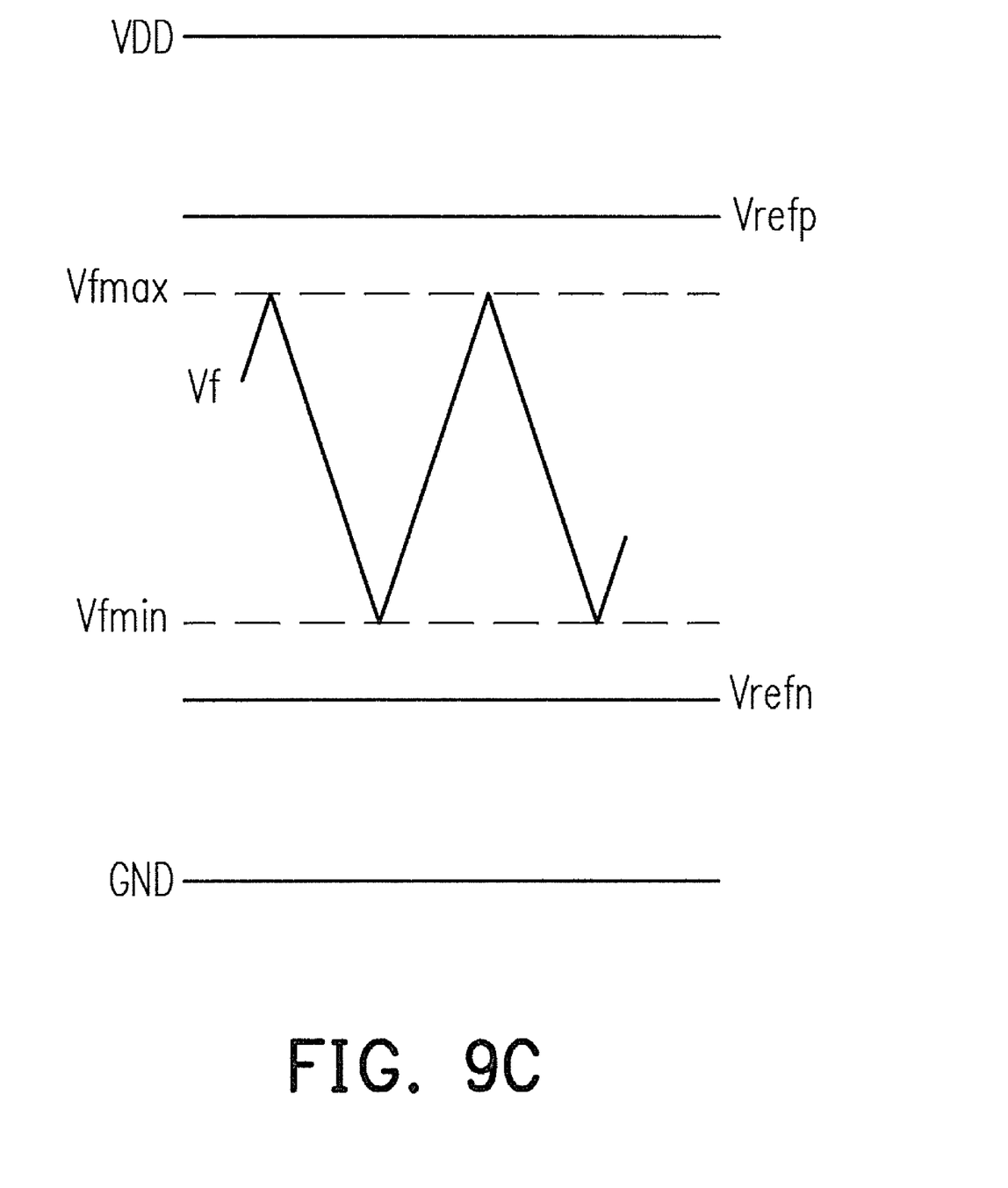

FIG. 9B and FIG. 9C are diagrams illustrating relations between the level of the triangle wave and the levels of the reference signals according to other embodiments of the present invention. Referring to FIG. 9B and FIG. 9C, the maximum value Vfmax of the level of the triangle wave of FIG. 9B is grater than the level of the reference signal Vrefp, and the minimum value Vfmin of the level of the triangle wave is less than the level of the reference signal Vrefn, wherein the level of the reference signal Vrefp is greater than the level of the reference signal Vrefn. Conversely, the maximum value Vfmax of the level of the triangle wave of FIG. 9C is less than the level of the reference signal Vrefp, and the minimum value Vfmin of the level of the triangle wave is greater than the level of the reference signal Vrefn. Here, the levels of the reference signals Vrefp and Vrefn are between the system level VDD and the ground level GND which are shown as the level relations in FIG. 9B and FIG. 9C.

With the loop filter 220 and the quantizer 240 of the present embodiment and the level relations of the triangle wave Vf and the reference signals Vrefp and Vrefn of FIG. 9B and FIG. 9C, the equivalent state of the driving current Io can also be achieved. Here, the waveform generator 250 generates the triangle wave Vf according to the reference signals Vrefp and Vrefn, so as to provide the reference frequency to the loop filter 220, and the reference signals Vrefp and Vrefn of the level generator 280 provide quantification reference levels for the error signal Ve quantified by the quantizer 240.

Figure 10:
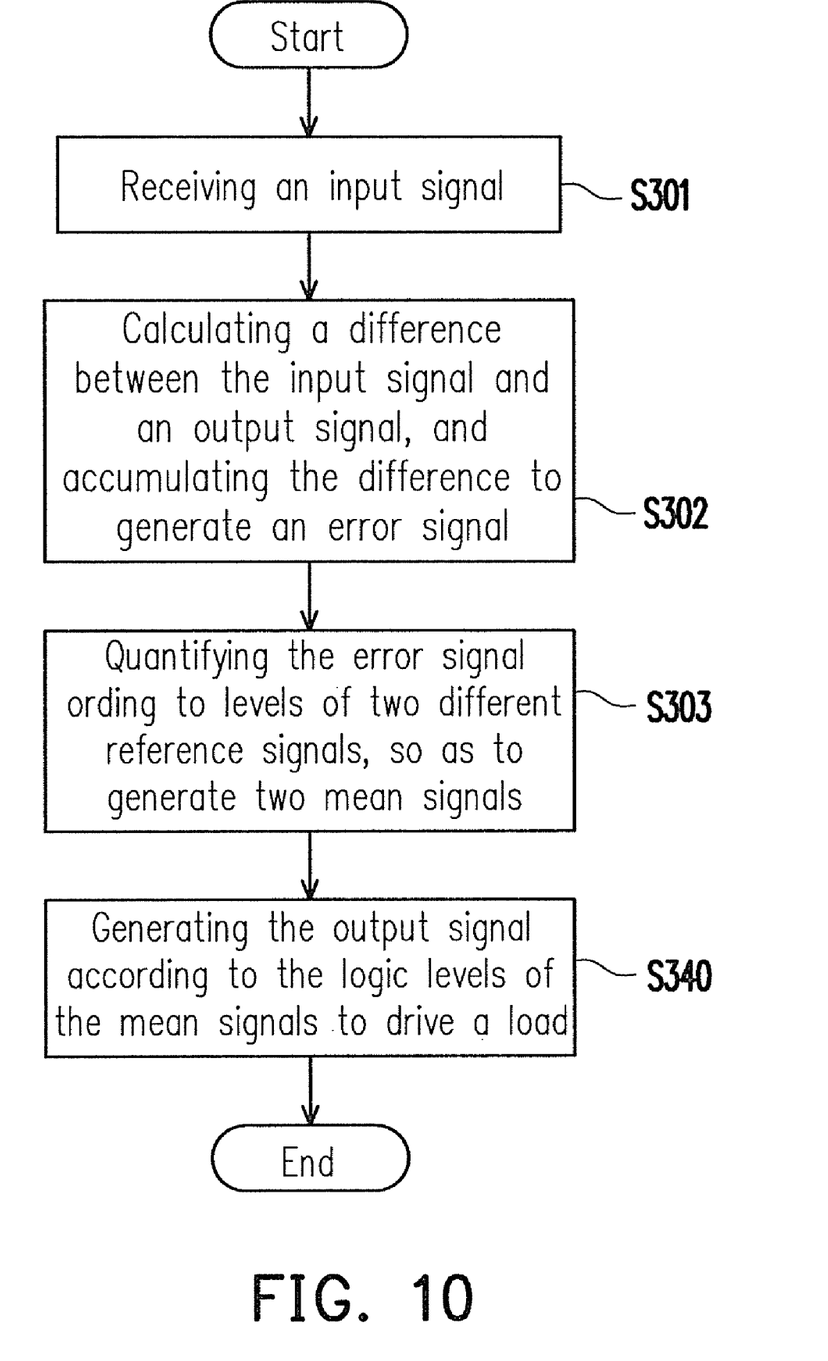
FIG. 10 is a flowchart illustrating a method of reducing a power loss of a sigma delta class D power amplifier according to an embodiment of the present invention.

The following flowchart is deduced from the aforementioned embodiments. FIG. 10 is a flowchart illustrating a method of reducing a power loss of a sigma delta class D power amplifier according to an embodiment of the present invention. Referring to FIG. 10, first, the input signal Vi is received (step S301). As described in the embodiment of FIG. 2, a difference between the input signal Vi and the output signal Vo is calculated and accumulated to generate the error signal Ve (step S302).

The error signal Ve is quantified according to the levels of the reference signals Vrefp and Vrefn to generate the mean signals M1 and M2 (step S303). As described in the embodiment of FIG. 4, when the mean signal M1 has the logic high level, and the mean signal M2 has the logic low level, the corresponding quantum state is "1". When the mean signal M1 has the logic low level, and the mean signal M2 has the logic high level, the corresponding quantum state is "−1". When the mean signals M1 and M2 both have the logic low level, the corresponding quantum state is "0".

The corresponding output signal Vo is generated according to the logic levels of the mean signals M1 and M2 to drive the load (step S304). As described in the embodiment of FIG. 7, the driving current Io of the output signal Vo is in one of the first driving state, the second driving state and the equivalent level state.

In summary, the sigma delta class D power amplifier utilizes the quantizer to quantify the error signal to generate the mean signals, wherein a different logic level combination of the mean signals corresponds to one of the equivalent levels of the three quantum states. The output stage module generates a corresponding driving current according to the mean signals output by the quantizer, wherein the driving current has a steady state (the equivalent level state) of no current.

In some embodiments, with the loop filter and the quantizer of the power amplifier and the level relations of the triangle wave and the reference signals, not only the excessive inductor current and the pop-noise phenomenon occurring when the power amplifier starts to operate can be avoided, but also the driving current may have a steady state of no current.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sigma delta class D power amplifier, comprising:
   a loop filter, calculating a difference between an input signal and an output signal, and accumulating the difference to generate an error signal;
   a quantizer, coupled to the loop filter, the quantizer quantifying the error signal according to levels of a first reference signal and a second reference signal and generating a corresponding first mean signal and a corresponding second mean signal; and
   an output stage module, coupled to the quantizer, the output stage module correspondingly generating the output signal according to the first mean signal and the second mean signal to drive a load, wherein a driving current of the output signal is at least in one of a first driving state, a second driving state and an equivalent level state.

2. The sigma delta class D power amplifier as claimed in claim 1, wherein the quantizer comprises:
   a first comparator, receiving the error signal, and quantifying the error signal to be a first logic signal according to the level of the first reference signal;
   a second comparator, receiving the error signal, and quantifying the error signal to be a second logic signal according to the level of the second reference signal; and
   a logic circuit, receiving the first logic signal and the second logic signal, and generating the corresponding first mean signal and the corresponding second mean signal after a logical processing.

3. The sigma delta class D power amplifier as claimed in claim 1 further comprising a level generator for generating the first reference signal and the second reference signal.

4. The sigma delta class D power amplifier as claimed in claim 3 further comprising a waveform generator generating a triangle wave having a reference frequency to the loop filter according to the first reference signal and the second reference signal generated by the level generator.

5. The sigma delta class D power amplifier as claimed in claim 4, wherein the levels of the first reference signal and the second reference signal relate to a maximum value and a minimum value of a level of the triangle wave.

6. The sigma delta class D power amplifier as claimed in claim 5, wherein the maximum value of the level of the triangle wave is equal to the level of the first reference signal, and the minimum value of the level of the triangle wave is equal to the level of the second reference signal.

7. The sigma delta class D power amplifier as claimed in claim 5, wherein a crest maximum value of the level of the triangle wave is greater than the level of the first reference signal, and a trough minimum value of the level of the triangle wave is less than the level of the second reference signal, though the level of the first reference signal is greater than the level of the second reference signal.

8. The sigma delta class D power amplifier as claimed in claim 5, wherein the maximum value of the level of the triangle wave is less than the level of the first reference signal, and the minimum value of the level of the triangle wave is greater than the level of the second reference signal.

9. The sigma delta class D power amplifier as claimed in claim 5, wherein the levels of the first reference signal and the second reference signal of the quantizer and the maximum value and the minimum value of the level of the triangle wave are all between a system level and a ground level.

10. The sigma delta class D power amplifier as claimed in claim 1, wherein the output stage module comprises:
 a first logic unit, receiving the first mean signal, and performing a logical processing to generate a first signal and a second signal corresponding to the first mean signal;
 a second logic unit, receiving the second mean signal, and performing the logical processing to generate a third signal and a fourth signal corresponding to the second mean signal;
 a first transistor, having a gate receiving the first signal, a first source/drain coupled to a system voltage, and a second source/drain coupled to a first end of the load;
 a second transistor, having a gate receiving the second signal, a first source/drain coupled to the second source/drain of the first transistor, and a second source/drain coupled to a ground voltage;
 a third transistor, having a gate receiving the third signal, a first source/drain coupled to the system voltage, and a second source/drain coupled to a second end of the load; and
 a fourth transistor, having a gate receiving the fourth signal, a first source/drain coupled to the second source/drain of the third transistor, and a second source/drain coupled to the ground voltage,
 wherein the second source/drain of the first transistor and the second source/drain of the third transistor generate the output signal.

11. A method for a sigma delta class D power amplifier, comprising:
 receiving an input signal;
 calculating a difference between the input signal and an output signal, and accumulating the difference to generate an error signal;
 quantifying the error signal according to levels of a first reference signal and a second reference signal, and generating a corresponding first mean signal and a corresponding second mean signal; and
 correspondingly generating the output signal according to the first mean signal and the second mean signal to drive a load, wherein a driving current of the output signal is at least in one of a first driving state, a second driving state and an equivalent level state.

12. The method for the sigma delta class D power amplifier as claimed in claim 11, wherein the levels of the first reference signal and the second reference signal relate to a maximum value and a minimum value of a level of a triangle wave.

13. The method for the sigma delta class D power amplifier as claimed in claim 12, wherein the maximum value of the level of the triangle wave is equal to the level of the first reference signal, and the minimum value of the level of the triangle wave is equal to the level of the second reference signal.

14. The method for the sigma delta class D power amplifier as claimed in claim 12, wherein the maximum value of the level of the triangle wave is greater than the level of the first reference signal, and the minimum value of the level of the triangle wave is less than the level of the second reference signal, though the level of the first reference signal is greater than the level of the second reference signal.

15. The method for the sigma delta class D power amplifier as claimed in claim 12, wherein the maximum value of the level of the triangle wave is less than the level of the first reference signal, and the minimum value of the level of the triangle wave is greater than the level of the second reference signal.

16. The method for the sigma delta class D power amplifier as claimed in claim 12, wherein the levels of the first reference signal and the second reference signal and the maximum value and the minimum value of the level of the triangle wave are all between a system level and a ground level.

* * * * *